(12) United States Patent
Jeong et al.

(10) Patent No.: US 10,512,959 B2
(45) Date of Patent: Dec. 24, 2019

(54) METHOD FOR MANUFACTURING SINGLE-CRYSTALLINE METAL ULTRAFINE WIRE

(71) Applicant: PUSAN NATIONAL UNIVERSITY INDUSTRIAL—UNIVERSITY COOPERATION FOUNDATION, Busan (KR)

(72) Inventors: Se-young Jeong, Busan (KR); Sang-eon Park, Busan (KR); Seung-hun Lee, Ulsan (KR); Seung Jeong, Seoul (KR); Hoon-chul Yang, Incheon (KR)

(73) Assignee: PUSAN NATIONAL UNIVERSITY INDUSTRIAL-UNIVERSITY COOPERATION FOUNDATION (KR)

( * ) Notice: Subject to any disclaimer, the term of this patent is extended or adjusted under 35 U.S.C. 154(b) by 561 days.

(21) Appl. No.: 15/306,583

(22) PCT Filed: Mar. 23, 2015

(86) PCT No.: PCT/KR2015/002836
§ 371 (c)(1),
(2) Date: Oct. 25, 2016

(87) PCT Pub. No.: WO2015/152551
PCT Pub. Date: Oct. 8, 2015

(65) Prior Publication Data
US 2017/0151595 A1    Jun. 1, 2017

(30) Foreign Application Priority Data
Apr. 3, 2014  (KR) .................. 10-2014-0040005

(51) Int. Cl.
*B21C 1/00* (2006.01)
*C30B 15/00* (2006.01)
(Continued)

(52) U.S. Cl.
CPC ............. *B21C 1/003* (2013.01); *B21C 1/08* (2013.01); *C30B 11/00* (2013.01); *C30B 11/02* (2013.01);
(Continued)

(58) Field of Classification Search
CPC ......... B21C 1/003; C30B 11/00; C30B 15/00; C30B 29/02; C30B 33/00
See application file for complete search history.

(56) References Cited

U.S. PATENT DOCUMENTS 3,359,077 A * 12/1967 Arst ................ C30B 15/14
117/30
5,827,366 A   10/1998 Watanabe
(Continued)

FOREIGN PATENT DOCUMENTS

| GB | 425316 A | * | 3/1935 | ............. A61L 17/06 |
| JP | 59102895 A | * | 6/1984 | ............. C30B 15/22 |

(Continued)

OTHER PUBLICATIONS

Machine Translation of JP59-102895, Translated Aug. 6, 2019, 7 Pages. (Year: 1984).*
(Continued)

*Primary Examiner* — Gregory D Swiatocha
(74) *Attorney, Agent, or Firm* — Park & Associates IP Law, P.C.

(57) ABSTRACT

A method for manufacturing an ultrafine single-crystalline metal wire is presented. The method continuously manufactures an ultrafine long single-crystalline wire by shaping a grown single-crystalline metal to have a circular or rectan-
(Continued)

gular cross section and then by drawing the shape-processed single-crystalline metal using a drawing machine. Therefore, the method simplifies manufacturing procedures to reduce manufacturing costs and lowers electrical resistance of a produced metal wire to improve the quality of the produced metal wire. The method includes: a first step of growing a single-crystalline metal ingot using a Czochralski or a Bridgman method; a second step of subjecting the single-crystalline metal ingot to a shaping process such that the single-crystalline metal ingot has a certain shape; and a third step of completing the manufacture of an ultrafine single-crystalline metal wire by drawing the shape-processed single-crystalline metal.

4 Claims, 5 Drawing Sheets

(51) Int. Cl.
| | |
|---|---|
| *C30B 11/00* | (2006.01) |
| *C30B 29/02* | (2006.01) |
| *C30B 33/00* | (2006.01) |
| *C30B 11/02* | (2006.01) |
| *C30B 29/64* | (2006.01) |
| *B21C 1/08* | (2006.01) |
| *B22F 1/00* | (2006.01) |

(52) U.S. Cl.
CPC ............. *C30B 15/00* (2013.01); *C30B 29/02* (2013.01); *C30B 29/64* (2013.01); *C30B 33/00* (2013.01); *B22F 1/0025* (2013.01)

(56) References Cited

U.S. PATENT DOCUMENTS

| | | | |
|---|---|---|---|
| 2009/0054971 A1* | 2/2009 | Mitsunaga | A61F 2/0095 623/1.42 |
| 2009/0211516 A1* | 8/2009 | Jeong | C30B 11/00 117/35 |
| 2011/0214785 A1* | 9/2011 | Buckman, Jr. | B21D 31/00 148/237 |
| 2015/0094616 A1* | 4/2015 | Simpson | A61M 25/09 600/585 |

FOREIGN PATENT DOCUMENTS

| | | |
|---|---|---|
| KR | 10-2005-0096893 A | 10/2005 |
| KR | 10-2009-0056845 A | 6/2009 |
| KR | 10-2009-0057633 A | 6/2009 |
| KR | 10-2010-0014201 A | 2/2010 |

OTHER PUBLICATIONS

International Search Report(PCT/KR2015/002836), WIPO, Jun. 29, 2015.

* cited by examiner

| DISTANCE BETWEEN TIPS (μm) | 50 | 100 | 200 | 400 |
|---|---|---|---|---|
| BEFORE PROCESSING (400μm* 600μm) Image | | | | |
| RESISTANCE (Ω) | 2.967 | 3.660 | 3.700 | 5.680 |

| DISTANCE BETWEEN TIPS (μm) | 50 | 100 | 140 |
|---|---|---|---|
| AFTER PROCESSING Ø180μm | | | |
| RESISTANCE (Ω) | 2.400 | 2.400 | 2.800 |

FIG. 3

| DISTANCE BETWEEN TIPS (μm) | 50 | 100 | 200 |
|---|---|---|---|
| BEFORE PROCESSING (400μm* 600μm) Image |  |  |  |
| RESISTANCE (Ω) | 2.967 | 3.660 | 3.700 |
| DISTANCE BETWEEN TIPS (μm) | 50 | 100 | 140 |
| AFTER PROCESSING Ø180μm |  |  |  |
| RESISTANCE (Ω) | 2.4 | 2.400 | 2.800 |

METHOD FOR MANUFACTURING SINGLE-CRYSTALLINE METAL ULTRAFINE WIRE

REFERENCE TO RELATED APPLICATIONS

This application is a U.S. National Phase application of International Application No. PCT/KR2015/002836, filed Mar. 23, 2015, and claims priority to Korean Patent Application No. 10-2014-0040005, filed Apr. 3, 2014, the disclosures of each of these applications being incorporated herein by reference in their entireties.

FIELD OF THE INVENTION

The present invention relates to a method for manufacturing an ultrafine single-crystalline metal wire. More particularly, the present invention relates to a method for continuously manufacturing an ultrafine long single-crystalline metal wire by shaping a grown single-crystalline metal to have a circular or rectangular cross section and then by drawing the shape-processed single-crystalline metal using a drawing machine, thus the method simplifies manufacturing procedures to reduce manufacturing costs and reduces electrical resistance to improve the quality of a metal wire.

BACKGROUND OF THE INVENTION

Generally, there are defects at the boundaries of domains formed by an irregular or regular arrangement of atoms in a metal solid. In order to minimize the defects, various methods such as increasing temperatures or applying pressures are used in the process of manufacturing a wire.

Recently, KR 10-2005-0096893 A (later patented in Korea as KR 10-0749833), referred hereinafter as "Patent Document 1", which was applied for a patent by the present applicant and patented thereto, disclosed a method for manufacturing a single-crystalline metal wire using a single crystalline metal to minimize defects in a produced metal wire.

As illustrated in FIG. 1, Patent Document 1 discloses a method for manufacturing a single-crystalline metal wire by processing a single-crystalline metal that is grown from a seed crystal having a crystalline structure in a growth crucible by using a wire cutter such that the single-crystalline metal has a disk shape and then processing again the disk-shaped single-crystalline metal to have a wire form by using the wire cutter.

However, according to Patent Document 1, the wire needs to be stretched straight and then subjected to surface grinding after the disk-shaped single-crystalline metal is processed to be a helical wire, using a wire cutter as illustrated in FIG. 1.

Accordingly, when the method of Patent Document 1 is used to manufacture a single-crystalline metal wire, the manufacturing procedures are complicated and take much time. For this reason, a production rate per unit time is limited, which deteriorates manufacturing efficiency and increases production costs.

SUMMARY OF THE INVENTION

Technical Problem

Accordingly, the present invention has been made keeping in mind the above problems occurring in the prior art, and an object of the present invention is to provide a method for manufacturing an ultrafine single-crystalline metal wire by continuously drawing a single-crystalline metal that is processed to have a predetermined shape using a drawing machine to produce an ultrafine single-crystalline metal wire having a predetermined diameter. Thus, the method lowers product prices of an ultrafine single-crystalline metal wire by improving manufacturing efficiency and increases usability of an ultrafine single-crystalline metal wire by improving the quality.

Objects and features of the present invention are not limited to ones described above, and other objects and features that are not described above will be clearly understood from the following description.

Technical Solution

In order to accomplish the objects of the present invention, according to one aspect, there is provided a method for manufacturing an ultrafine single-crystalline metal wire, the method comprising: a first step of growing a single-crystalline metal ingot through a Czochralski method or a Bridgeman method; a second step of subjecting the single-crystalline metal ingot to a shaping process to produce a single-crystalline metal having a predetermined shape; and a third step of completing manufacture of an ultrafine single-crystalline metal wire by drawing the shape-processed single-crystalline metal.

In the second step, the single-crystalline metal may be processed to have a square pillar shape, a cylinder shape, or a wire shape.

In the second step, the shaping is performed through any one process selected from the group consisting of milling, press working, wire cutting, waterjet discharging, and three-dimensional discharging.

The method may further include a fourth step of polishing a surface of the shape-processed single-crystalline metal, the fourth step being performed between the second step and the fourth step.

In the third step, the single-crystalline metal may be continuously repeatedly drawn multiple times while maintaining a cross section reduction rate of 15 to 25%.

The metal may be any one metal selected from the group consisting of cooper, aluminum, gold, silver, and nickel.

Advantageous Effects

The method according to the present invention can manufacture an ultrafine single-crystalline metal wire through simple manufacturing procedures, thereby improving manufacturing efficiency and lowering manufacturing costs. In addition, an ultrafine single-crystalline metal wire manufactured according to the manufacturing method of the present invention has relatively lower electrical resistance compared to a single-crystalline metal ingot. Therefore, the present invention can improve the quality of ultrafine single-crystalline metal wires and thus it is expected that the demand for ultrafine single-crystalline metal wires will increase.

BRIEF DESCRIPTION OF THE DRAWINGS

FIG. 3 is a table showing a comparison of electrical resistance between an ultrafine single-crystalline metal wire manufactured according to the manufacturing method of the present invention and single-crystalline copper that is not yet subjected to a drawing process;

DETAILED DESCRIPTION OF THE INVENTION

Best Mode

Hereinafter, a method for manufacturing an ultrafine single-crystalline metal wire according to the present invention will be described with reference to the accompanying drawings.

Figure 1:
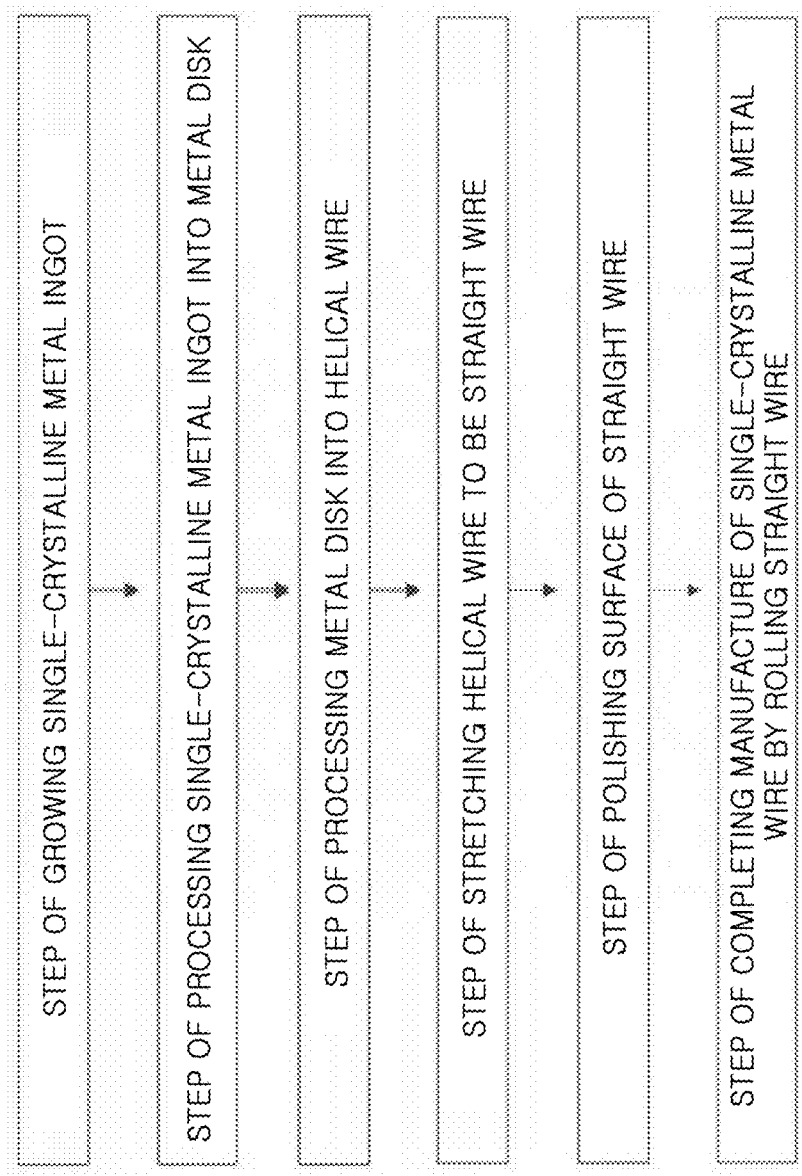
FIG. 1 is a block diagram illustrating a conventional method for manufacturing a single-crystalline metal wire.
Figure 2:
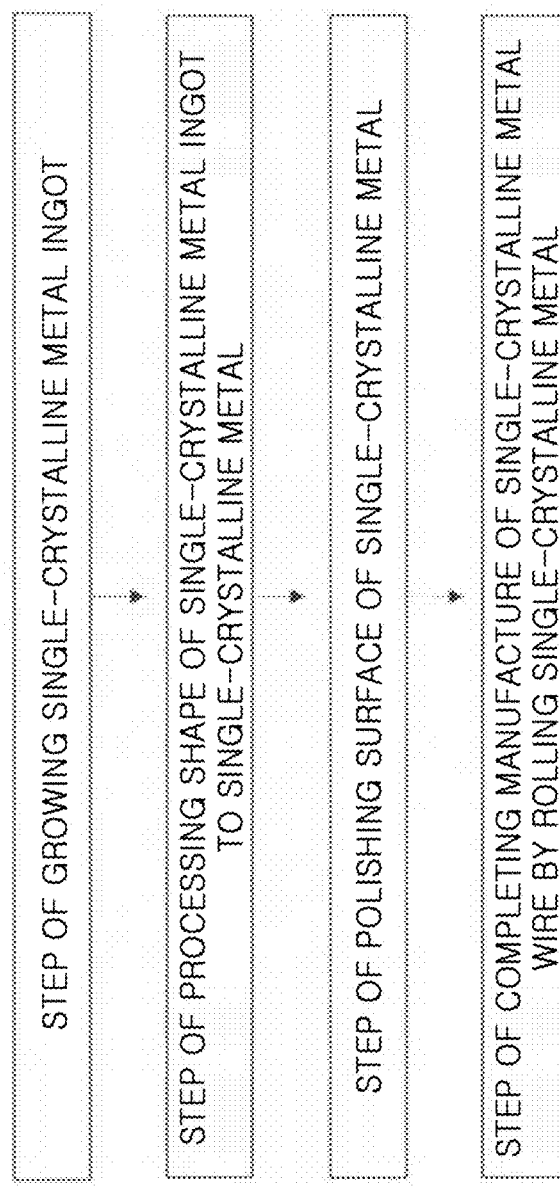
FIG. 2 is a block diagram illustrating a method for manufacturing an ultrafine single-crystalline metal wire according to one embodiment of the present invention.

FIG. 2 is a block diagram illustrating a method for manufacturing an ultrafine single-crystalline metal wire according to one embodiment of the present invention.

The method for manufacturing an ultrafine single-crystalline metal wire according to the present invention is a method of manufacturing an ultrafine single-crystalline metal wire by processing a single-crystalline metal that is grown to prevent structural defects that generally occur in conventional metal wires. The manufacturing method of the present invention has simplified procedures, thereby enabling low manufacturing costs, high manufacturing efficiency, and high quality of produced metal wires.

As illustrated in FIG. 2, these advantages and features can be achieved by a method of manufacturing an ultrafine single-crystalline metal wire having a predetermined diameter by processing a single-crystalline metal ingot that is grown from a metal selected from the group consisting of copper, aluminum, gold, silver, and nickel to have a predetermined shape and then by drawing the shape-processed metal.

That is, the advantages and features can be achieved by performing: a first step of melting a lump of metal and growing a single-crystalline metal ingot from the molten metal using a seed crystal; a second step of processing, by using a processing means, the single-crystalline metal ingot into a single-crystalline metal having a predetermined shape; and a third step of drawing the single-crystalline metal using a drawing machine to produce an ultrafine single-crystalline metal wire having a predetermined diameter.

Preferably, in the first step, the single-crystalline metal ingot may be grown through a Czochralski method or a Bridgeman method.

A growth crucible used in the process of melting the lump of metal may be a single crucible consisting of a quartz crucible or a double crucible consisting of an inner crucible that is made of boron nitride (BN), alumina, or quartz, and an outer crucible that is made of graphite.

During the growing, the growth crucible is heated using an induction coil or a carbon heater to a temperature higher than a melting point of the lump of metal.

In the second step, the single-crystalline metal ingot is processed to have a square pillar shape, a cylinder shape, or a wire shape.

When processing the single-crystalline metal ingot to have a square pillar shape, a cylinder shape, or a wire shape, any one process selected from the group consisting of milling, press working, wire cutting, waterjet discharging, and three-dimensional discharging may be used.

At this point, when the ingot is processed to have a square pillar shape or a cylinder shape, a relatively longer length of an ultrafine single-crystalline metal wire can be produced through the drawing process compared to when the ingot is processed to have a wire shape.

On the other hand, when the ingot is processed to have a wire shape, the length of the ultrafine single-crystalline metal wire manufactured through the drawing process is relatively shorter compared to the case of being processed to have a square pillar shape or a cylinder shape. Therefore, when the ingot is processed to have a wire shape, the manufacturing method may further include a step of joining two ultrafine single-crystalline metal wires by pressing ends of the two ultrafine single-crystalline metal wires.

In the third step, the drawing process may be repeated one or more times while maintaining a cross section reduction rate of 15 to 25% until the diameter of the ultrafine single-crystalline metal wire becomes a predetermined value.

That is, while maintaining such a cross section reduction rate of the ultrafine single-crystalline metal wire, the drawing is continuously performed using a continuous drawing machine in which a plurality of drawing machines is connected in series at multiple stages, or is repeatedly performed many times using a general single drawing machine.

When the cross section reduction rate is higher than the described range, electrical resistance of the produced wire is increased due to stress attributed to pressure applied thereto and thus the desired electrical characteristics cannot be obtained. On the other hand, when the cross section reduction rate is lower than the described range and the number of times of drawing increases, work speed is too slow, which deteriorates manufacturing efficiency. Therefore, it is preferable to perform the drawing process while maintaining the cross section reduction rate described above.

Alternatively, a fourth step of polishing the surface of the single-crystalline metal may be performed between the second step and the third step as illustrated in FIG. 2. This step minimizes oxidation on the surface of the single-crystalline metal because oxidation occurs when the single-crystalline is in contact with air.

Hereinafter, the method of manufacturing an ultrafine single-crystalline metal wire according to the preferred embodiment of the present invention will be described in detail.

First, a lump of copper is introduced into a double growth crucible and heated through induction heating so that the copper can be melted in the double growth crucible. While the double growth crucible is being heated, the bottom surface of a seed crystal is brought into contact with molten copper and is slowly pulled up so that a single-crystalline copper ingot can be grown through the Czochralski method.

At this point, since copper does not actively chemically combine with carbon, a graphite crucible serving as a heating element is used as an inner crucible of the double growth crucible. The seed crystal may have a bar shape having a single orientation (111).

The heating temperature of the growth crucible may be set to 1000 to 1100° C. which is higher by about 30° C. than the melting point of copper. Thus, the temperature of the molten copper is adjusted at 0.1 to 1° C./min so that the lump of copper can be completely melted to be grown.

Next, the grown single-crystalline copper ingot is subjected to a shaping process so that the single-crystalline copper ingot may have a shape by which the single-crystalline copper can be easily drawn through a drawing machine.

That is, through the shaping process, cylindrical single-crystalline copper having a length of 100 mm or longer is formed by using a milling machine, which is one of various processing machines.

Next, in order to minimize oxidation on the surface of the cylindrical single-crystalline copper, the surface of the cylindrical single-crystalline copper is ground and polished.

Finally, the single-crystalline copper that has undergone the surface polishing is introduced into a continuous drawing machine to be drawn at a speed of 6 m/sec. Thus, the manufacturing of an ultrafine single-crystalline copper wire having a diameter of 180 µm is finished.

Hereinafter, the characteristics of the ultrafine single-crystalline copper wire manufactured according to the method of manufacturing an ultrafine single-crystalline wire according to the preferred embodiment of the present invention will be described in detail.

Figure 4:
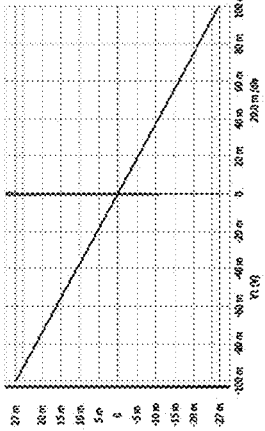
FIG. 4 is a graph showing a comparison of electrical resistance between an ultrafine single-crystalline metal wire manufactured according to the manufacturing method of the present invention and single-crystalline copper that is not yet subjected to a drawing process.
Figure 4:
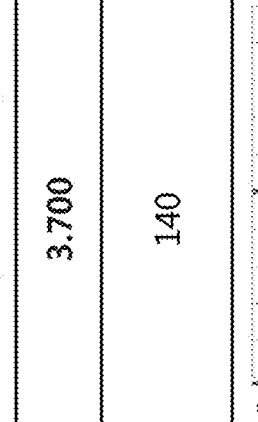
Figure 4:
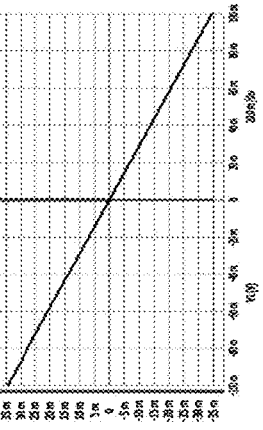
Figure 4:
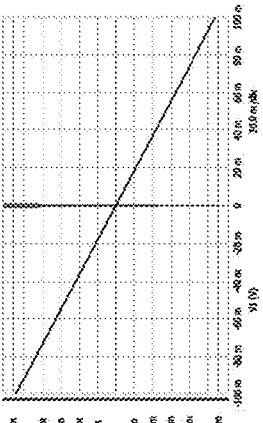
Figure 4:
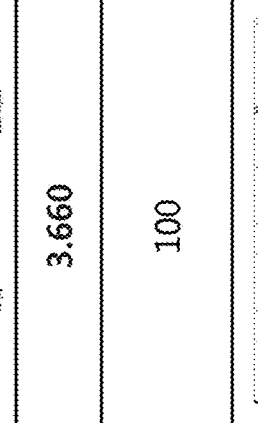
Figure 4:
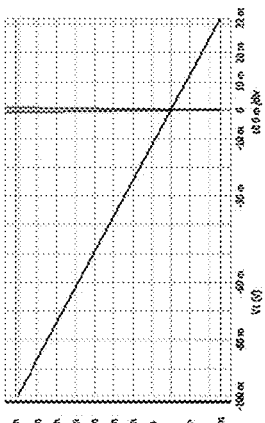

First, FIG. 3 shows a comparison of electrical resistance between an ultrafine single-crystalline copper wire manufactured according to the method of the present invention and single-crystalline copper that is not yet subjected to a drawing process, and FIG. 4 shows a comparison of electrical resistance between an ultrafine single-crystalline copper wire manufactured according to the method of the present invention and single-crystalline copper that is not yet subjected to a drawing process.

According to FIGS. 3 and 4, it is found that the ultrafine single-crystalline copper wire according to the preferred embodiment of the present invention has lower electrical resistance than the single-crystalline copper that is not yet subjected to a drawing process even while the ultrafine single-crystalline copper wire has suffered from stress during the drawing process.

Figure 5:
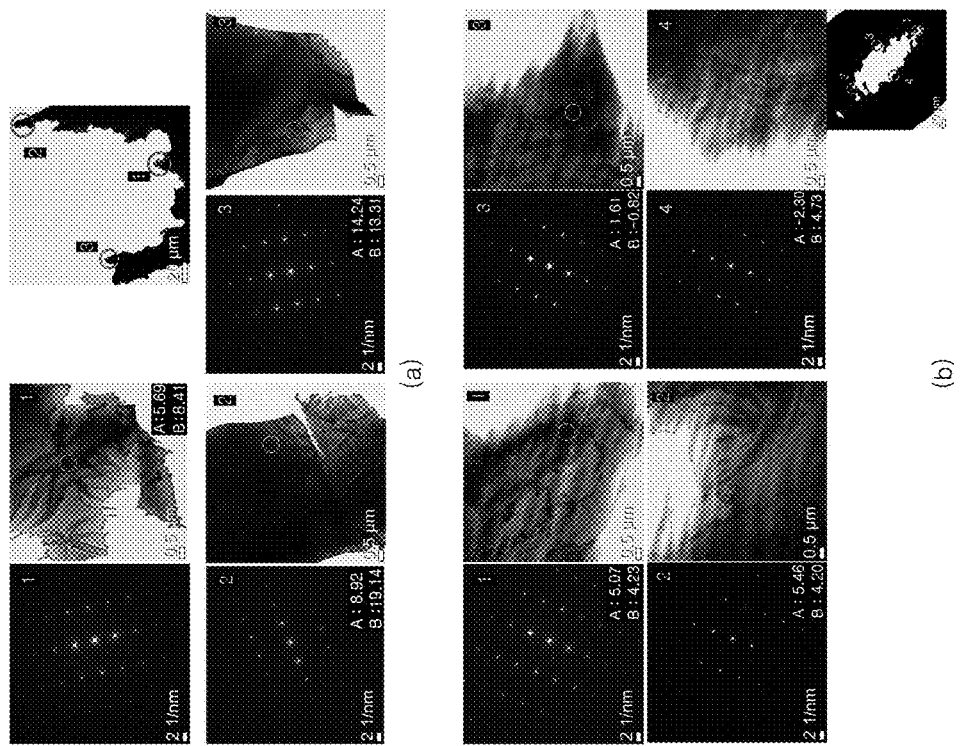
FIGS. 5(a) and 5(b) are, respectively, transmission electron microscope (TEM) photographs showing nano-scale crystallinity of an ultrafine single-crystalline metal wire manufactured according to the manufacturing method of the present invention and single-crystalline copper that is not yet subjected to a drawing process.

FIG. 5 shows TEM photographs to compare nano-scale crystallinity of an ultrafine single-crystalline copper wire (b) manufactured according to the present invention and nano-scale crystallinity of single-crystalline copper (a) that is not subjected to a drawing process.

According to FIG. 5, it is possible to verify the ultrafine single-crystalline copper wire manufactured according to the present invention has similar crystallinity to the single-crystalline copper which is not subjected to a drawing process even though it has suffered stress attributed to a drawing process As described above, the method for manufacturing an ultrafine single-crystalline metal wire according to the present invention has simplified manufacturing procedures, thereby enabling mass production of defect-free ultrafine single-crystalline metal wires having a good electrical conductivity. Thus, it is possible not only to improve the quality of ultrafine single-crystalline metal wires but also to promote the demand for ultrafine single-crystalline metal wires.

Although a preferred embodiment of the present invention has been described for illustrative purposes, those skilled in the art will appreciate that various modifications, additions and substitutions are possible, without departing from the scope and spirit of the invention as disclosed in the accompanying claims.

Accordingly, the substantial technical protection scope of the present invention will include not only the above-described embodiments but also modifications thereof, based on the spirit of the present invention which is defined by the appended claims.

INDUSTRIAL APPLICABILITY

The present invention relates to a method for manufacturing an ultrafine single-crystalline metal wire. More particularly, the present invention relates to a method for manufacturing an ultrafine single-crystalline metal wire by subjecting a grown single-crystalline metal to a shaping process so that the grown single-crystalline metal has a cylinder shape or a square pillar shape and then performing a drawing process using a drawing machine to continuously produce a long length of ultrafine single-crystalline metal wire. Thus, the present invention simplifies manufacturing procedures to reduce manufacturing costs and lowers electrical resistance to improve the quality of the produced ultrafine metal wires. Therefore, the present invention can be used in the field of manufacturing ultrafine single-crystalline metal wires.

What is claimed is:

1. A method for manufacturing an ultrafine single-crystalline metal wire, the method comprising:
    a first step of growing a single-crystalline metal ingot through a Czochralski method or a Bridgeman method;
    a second step of subjecting the single-crystalline metal ingot to a shaping process to produce a single-crystalline metal having a predetermined shape;
    a third step of polishing a surface of the shape-processed single-crystalline metal; and
    a fourth step of completing manufacturing of the ultrafine single-crystalline metal wire by drawing the shape-processed single-crystalline metal performed continuously and repeatedly multiple times while maintaining a cross section reduction of 15 to 25% per one time drawing, wherein the manufactured ultrafine single-crystalline metal wire has a lower electrical resistance than the single-crystalline metal ingot.

2. The method for manufacturing the ultrafine single-crystalline metal wire according to claim 1, wherein in the second step, the single-crystalline metal ingot is processed to have a square pillar shape, a cylinder shape, or a wire shape.

3. The method for manufacturing the ultrafine single-crystalline metal wire according to claim 1, wherein in the second step, the shaping process is performed through any one process selected from the group consisting of milling, press working, wire cutting, waterjet discharging, and three-dimensional discharging.

4. The method for manufacturing the ultrafine single-crystalline metal wire according to claim 1, wherein the metal may be any one metal selected from the group consisting of copper, aluminum, gold, silver, and nickel.

* * * * *